Nov. 26, 1963 H. G. RUDENBERG 3,112,230
PHOTOELECTRIC SEMICONDUCTOR DEVICE
Filed Nov. 27, 1959
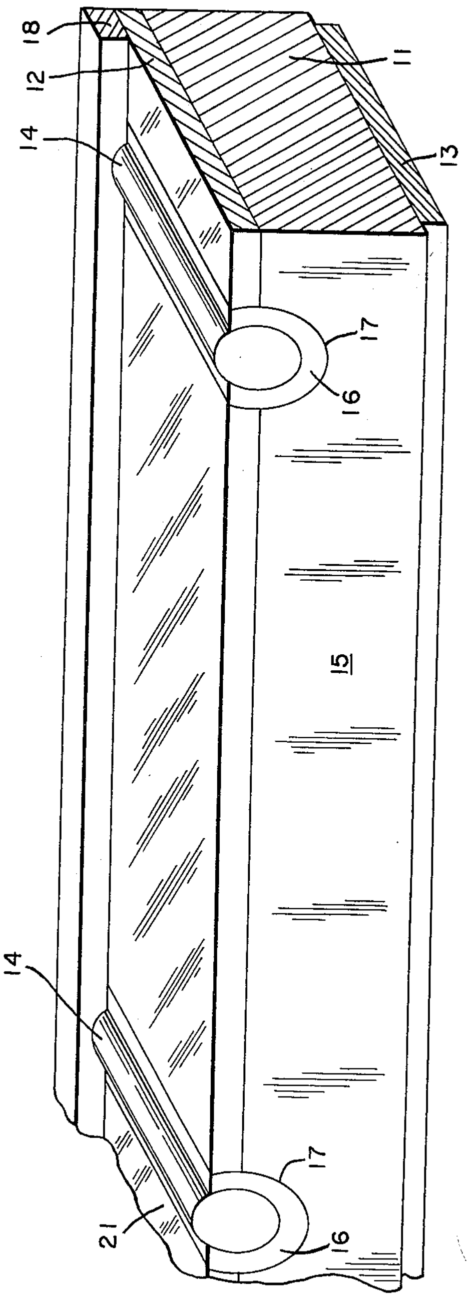
INVENTOR.
HERMANN G. RUDENBERG
BY
Ezekiel Wolf, Wolf & Greenfield
ATTORNEYS United States Patent Office 3,112,230
Patented Nov. 26, 1963

3,112,230
PHOTOELECTRIC SEMICONDUCTOR DEVICE
Hermann Gunther Rudenberg, Beverly, Mass., assignor to Transitron Electronic Corporation, Wakefield, Mass., a corporation of Delaware
Filed Nov. 27, 1959, Ser. No. 855,605
1 Claim. (Cl. 136—89)

The present invention relates in general to photoelectric semiconductor devices and more particularly concerns a novel device for converting light energy into an electrical current with great efficiency. The invention is specifically concerned with the provision of a solar energy cell.

A typical solar energy cell consists of a body of N-type silicon with an ohmic conductive connection to one surface. Boron is diffused into the opposite surface of the silicon body to establish a P-type layer and form a PN junction at the boundary with the N-type material of the main silicon body. Light shining upon and through the thin surface layer produces electrical carriers in both layers of the respective conductivity types. Most of these carriers drift toward the junction where they collect in the form of a charge layer which builds up a voltage between the ohmic contacts to the P-type and N-type layers. The charge may be withdrawn and used to energize an external load circuit.

Prior art devices have a number of problems. The effective series resistance presented by contacts and connections wastes power. Thick surface layers are disadvantageous because too much light is absorbed. On the other hand, thin surface layers are generally characterized by a relatively high surface resistance which increases the effective source resistance presented by the solar energy cell.

If a heavy boron deposition is used in forming the thin surface layer or the boron becomes oxidized during the diffusion process, the dark surface coating produced thereby absorbs incident light and reduces the efficiency of the photoelectric conversion process. Efficiency and output voltage are also reduced if the lifetime of carriers in the surface layer and the body of the material is too small.

In prior art devices contacts to the P-layer on the front surface are of such large area that they prevent a considerable amount of light energy from reaching the light sensitive layers. If these contacts were placed on the back surface, they would add effective series resistance to the cell. Still another disadvantage is that the shunt resistance of the cell by-passes the load if the current is heavy.

Accordingly, the present invention contemplates and has as an important object the provision of an efficient solar energy cell.

A more specific object of the invention is the provision of a semiconductor photoelectric transducer characterized by an exceptionally low series resistance to a very thin light transmissive surface layer of boron deposition so that light readily penetrates the thin surface layer, thereby allowing a given amount of light energy to produce an increased charge accumulation across the PN junction.

It is another object of the invention to provide a photoelectric transducer in accordance with the preceding objects in which thin wires establish a low resistance contact to a very thin surface layer so that nearly the entire thin surface layer is exposed to incident light.

Still another object of the invention is to provide a method for producing photoelectric transducers which achieve the preceding objects.

A photoelectric semiconductor device according to the invention comprises a body of semiconductor material of one conductivity type having a thin surface layer of opposite conductivity type and thin conducting wires embedded in the thin surface layer with a regrown region of said opposite conductivity type surrounding the thin wires and separated from the main body by a rectifying junction. An ohmic contact attached to the opposite surface of the main body forms one terminal of the energy cell, the connected together embedded wires forming the other.

According to the method for fabricating the device, after a thin layer of substance is diffused into the main body of the device to form a thin layer of said opposite conductivity type, thin wires are melted into the thin surface layer and then allowed to cool to form the regrown junction. Preferably, the wires are first placed in contact with the thin surface layer, the body and contacting wires then being heated in an inert atmosphere maintained at a temperature of at least 700 degrees centigrade. If the temperature maintained therein is raised to 1100 degrees centigrade, it has been discovered that a further improvement is obtained in that the shunt resistance presented across the energy cell is appreciably increased.

Other features, objects and advantages of the invention will become apparent from the following specification when read in connection with the accompanying drawing, the single FIGURE of which shows a representative embodiment of the invention.

With reference now to the drawing, the main body consists of N-type silicon in the thick layer 11. A thin P-type layer 12 is diffused into the block 11. An ohmic contact 13 is attached to the bottom surface of the layer 11.

Conducting wires 14 are shown embedded in and penetrating the thin layer 12 through the original PN junction 15 established by the initial diffusion of the boron into the N-type silicon block.

A regrown region 16 borders each wire and establishes a barrier layer of rectifying junction 17 which separates the regrown region from the N-type layer 11. A thin conducting wire 18 is connected to both of the wires 14 for connecting them to an external terminal. Light shining upon the surface layer 21 develops a potential between conducting layer 13 and conducting wire 18 which may be used to power an external device.

It is to be understood that while the drawing only shows two wires embedded in the surface layer, much larger blocks may be employed having many parallel embedded wires. Also, a second group of parallel embedded wires may be provided criss-crossing the first parallel group. By increasing the number of parallelly connected conductors, the effective series resistance is reduced. However, it is preferred that the separation between adjacent parallel conductors be much larger than the thickness of each conductor so that a relatively large surface area remains exposed to incident light.

Having described devices according to the invention, novel techniques for fabricating the devices will be discussed. Boron is diffused into slices of silicon to a depth of 0.1 mil by well-known diffusion techniques. Aluminum wires are helically wound around the slice, the wires being 1–2.3 mils thick with the spacing between adjacent wires on the diffused layer surface being approximately 25 mils. The wires are alloyed to the surface layer by heating the assembly in an inert atmosphere of argon or a vacuum at a temperature of 700° centigrade for 15 minutes. It has been discovered that a solar energy cell according to the invention exhibits a higher shunt resistance to an external load if the assembly is heated to a temperature of 1100° C. for 15 minutes during the alloying process.

The surfaces of the slice, other than the diffused layer surface, are then milled so that the diffused layer surface includes the parallelly embedded aluminum wires. A single wire may then be laid across the embedded wires and electrically connected to each one to provide one terminal of the solar energy cell and an ohmic contact is attached to the bottom surface of the crystal slice to form the other terminal of the solar energy cell.

Instead of winding the wires around the slice and then milling the surface of the slice, the wires may be alloyed to the slice by using a jig to position separate parallel wires against the surface of the diffused layer. Alternately, the conducting wires may be placed in contact with the diffused layer surface by evaporating conducting material onto the surface through a mask of slots.

The wires are preferably alloyed or diffused into or through the surface layer. This establishes a low resistance connection to many parts of the surface layer. When the metal penetrates the original barrier layer, an effective high shunt resistance is presented to an external load.

The wires are preferred because of their low resistance. Still another advantage of the fabricating techniques is the self-gettering of impurities into the wire from the silicon during the alloying process. This extends the carrier life time and raises the junction shunt resistance.

While aluminum wires have actually been employed, silver or gold wires or strips, doped with an impurity for low resistance to the surface layer and high shunt resistance to the rest of the silicon body may be used also.

In the specific embodiment described herein, a thin P-type surface layer is diffused into an N-type block. The principles of the invention could also be embodied with an N-type surface layer upon a P-type block. This could be achieved by diffusing arsenic or antimony into P-type silicon while using silver arsenic wire embedded in the thin surface layer.

Also intermetallic semiconducting compounds, such as gallium arsenide, may be used to form the different semiconductor layers. If the thin surface layers were P-type, and the main body N-type, zinc strips could be evaporated upon the thin surface layer preparatory to diffusion and recrystallization.

There has been described an exceptionally efficient semiconductor photoelectric transducer and novel methods of its fabrication resulting in the provision of an exceptionally efficient solar energy cell. It is apparent that those skilled in the art may now make numerous modifications of and departures from the specific devices and techniques described herein without departing from the inventive concepts. Consequently, the invention is to be construed as limited only by the spirit and scope of the appended claim.

What is claimed is:

A photoelectric semiconductor device made by diffusing a substance of one conductivity type into one surface of a block of silicon semiconductor material of opposite conductivity type to establish a thin surface layer of said one conductivity type in said block adjacent to a rectifying junction, melting conductors into said thin layer generally parallel to one another and separated by a distance at least ten times greater than the thickness of each, allowing said melted conductors and adjacent regions of said thin layer to solidify around said conductors to establish a regrown region around said wires separated from said opposite conductivity type portions in said block by a rectifying junction, and conductively interconnecting said conductors while leaving the exposed area of said surface much greater than the area of said conductors and the means conductively interconnecting them, said thin layer including boron, and said conductors being aluminum melted into said block in an inert atmosphere at a temperature of substantially 1,100° C.

References Cited in the file of this patent

UNITED STATES PATENTS

| | | |
|---|---|---|
| 2,428,537 | Veszi et al. | Oct. 7, 1947 |
| 2,644,852 | Dunlap | July 7, 1953 |
| 2,771,382 | Fuller | Nov. 20, 1956 |
| 2,861,909 | Ellis | Nov. 25, 1958 |
| 2,898,248 | Silvey | Aug. 4, 1959 |
| 2,904,613 | Paradise | Sept. 15, 1959 |